(12) United States Patent
Jang et al.

(10) Patent No.: US 10,515,841 B2
(45) Date of Patent: Dec. 24, 2019

(54) METHOD FOR DIVIDING SUBSTRATE ALONG DIVISION LINES USING ABRASIVE MEMBER HAVING PROJECTION FOR CUTTING SUBSTRATE

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/025,075

(22) Filed: Jul. 2, 2018

(65) Prior Publication Data

US 2019/0006224 A1 Jan. 3, 2019

(30) Foreign Application Priority Data

Jul. 3, 2017 (JP) .................................. 2017-130292

(51) Int. Cl.
*H01L 21/463* (2006.01)
*H01L 21/683* (2006.01)
(Continued)

(52) U.S. Cl.
CPC ........ *H01L 21/6836* (2013.01); *B28D 5/0029* (2013.01); *B28D 5/0052* (2013.01); *B28D 5/023* (2013.01); *H01L 21/304* (2013.01); *H01L 21/3043* (2013.01); *H01L 21/463* (2013.01); *H01L 21/56* (2013.01); *H01L 21/561* (2013.01); *H01L 21/67092* (2013.01); *H01L 21/67121* (2013.01); *H01L 21/78* (2013.01); *H01L 23/552* (2013.01); *H01L 24/97* (2013.01);
(Continued)

(58) Field of Classification Search
CPC . H01L 21/304; H01L 21/3043; H01L 21/463; H01L 21/6835; H01L 21/6836; H01L 2221/68327; H01L 2221/68331; H01L 2221/68336; H01L 24/97; H01L 2224/95091; H01L 2224/97; B28D 5/0023; B28D 5/0029; B28D 5/0035; B28D 5/0052; B28D 5/022; B28D 5/023; B28D 5/029
See application file for complete search history.

(56) References Cited

U.S. PATENT DOCUMENTS 8,757,134 B2 * 6/2014 Kim .................... B24D 5/12
125/11.01
10,050,006 B2 * 8/2018 Shen ............... H01L 21/30604
(Continued)

FOREIGN PATENT DOCUMENTS

JP 2015018965 A 1/2015

*Primary Examiner* — Stephen W Smoot
(74) *Attorney, Agent, or Firm* — Greer Burns & Crain, Ltd.

(57) ABSTRACT

There is provided a processing method for a package substrate having a plurality of division lines formed on the front side. The processing method includes the steps of holding the back side of the package substrate by using a holding tape and fully cutting the package substrate along the division lines to such a depth corresponding to the middle of the thickness of the holding tape by using a profile grinding tool, thereby dividing the package substrate into individual semiconductor packages. The profile grinding tool has a plurality of projections for cutting the package substrate respectively along the plural division lines. Each projection has an inclined side surface.

4 Claims, 8 Drawing Sheets

(51) Int. Cl.
*H01L 21/78* (2006.01)
*H01L 21/304* (2006.01)
*H01L 21/67* (2006.01)
*H01L 23/00* (2006.01)
*B28D 5/00* (2006.01)
*B28D 5/02* (2006.01)
*H01L 21/56* (2006.01)
*H01L 23/552* (2006.01)
*H01L 23/31* (2006.01)

(52) U.S. Cl.
CPC ............ *H01L 23/3128* (2013.01); *H01L 2221/68331* (2013.01); *H01L 2224/48091* (2013.01); *H01L 2224/48227* (2013.01); *H01L 2224/97* (2013.01); *H01L 2924/15311* (2013.01); *H01L 2924/181* (2013.01); *H01L 2924/1815* (2013.01)

(56) References Cited

U.S. PATENT DOCUMENTS

| | | | |
|---|---|---|---|
| 2007/0173035 A1* | 7/2007 | Izumi | B28D 5/022 438/464 |
| 2014/0110842 A1* | 4/2014 | Zenz | H01L 23/31 257/738 |
| 2015/0183131 A1* | 7/2015 | Foong | B28D 5/022 451/544 |
| 2015/0364375 A1* | 12/2015 | Nakamura | H01L 21/268 438/462 |
| 2016/0279753 A1* | 9/2016 | Sekiya | B24B 19/02 |
| 2018/0096948 A1* | 4/2018 | Kim | B23K 26/402 |
| 2019/0067050 A1* | 2/2019 | Jang | H01L 21/67092 |

* cited by examiner

METHOD FOR DIVIDING SUBSTRATE ALONG DIVISION LINES USING ABRASIVE MEMBER HAVING PROJECTION FOR CUTTING SUBSTRATE

BACKGROUND OF THE INVENTION

Field of the Invention

The present invention relates to a substrate processing method.

Description of the Related Art

In a device manufacturing step, any substrate such as a wafer and a semiconductor package substrate is cut along streets by using a cutting blade to thereby form individual device chips. As such a substrate processing method, step cutting is known, wherein two kinds of blades are used to stepwise increase the depth of cut in the substrate. In this step cutting, a thick straight blade or a V blade is first used to form a shallow groove on the substrate along each street, and a thin straight blade is next used to cut the bottom surface of each shallow groove until the substrate is fully cut (see Japanese Patent Laid-Open No. 2015-018965, for example).

SUMMARY OF THE INVENTION

There is a desire such that the side surface of each chip obtained by dividing the substrate is inclined or stepped, depending upon the kind of the substrate. By adopting the step cutting described in Japanese Patent Laid-Open No. 2015-018965 mentioned above, the side surface of each chip can be inclined or stepped. However, in this step cutting, the two kinds of blades must be used to stepwise cut the substrate, causing a problem such that the number of man-hours is increased and the working time is increased.

It is therefore an object of the present invention to provide a substrate processing method which can divide a substrate into individual chips and simultaneously form an inclined side surface or a stepped side surface on each chip.

In accordance with an aspect of the present invention, there is provided a substrate processing method for dividing a substrate along a plurality of division lines formed on the front side of the substrate to obtain individual chips and simultaneously providing a desired shape on each chip. The substrate processing method includes a holding step of holding the back side of the substrate by using a holding tape or a holding jig, and a dividing step of fully cutting the substrate along the division lines to such a depth corresponding to the middle of the thickness of the holding tape or the holding jig by using a shaped abrasive member after performing the holding step, thereby dividing the substrate into the individual chips. The shaped abrasive member has a projection for cutting the substrate, the projection having an inclined side surface or a vertical side surface with a step portion. The dividing step includes the steps of cutting the substrate along each division line by using the projection to thereby divide the substrate into the individual chips and simultaneously forming an inclined side surface or a stepped side surface on each chip according to the inclined side surface or the vertical side surface with the step portion of the projection. The inclined side surface or the stepped side surface on each chip are formed so that the lower surface of each chip becomes larger than the upper surface of each chip.

With this configuration, the substrate is fully cut along each division line by the projection of the shaped abrasive member and thereby divided into the individual chips. At the same time, an inclined side surface or a stepped side surface is formed on each chip by the inclined side surface or the vertical side surface with the step portion of the projection. Accordingly, the division of the substrate along the division lines and the formation of the inclined side surface or the stepped side surface of each chip can be simultaneously performed, so that the number of man-hours can be reduced and the working time can be greatly reduced.

Preferably, the projection includes a plurality of projections individually corresponding to the plurality of division lines, each of the projections having an inclined side surface or a vertical side surface with a step portion.

Preferably, the shaped abrasive member further has a cylindrical base having an abrasive grain layer on the outer circumferential surface thereof, and the projection projects radially outward from the outer circumferential surface of the cylindrical base in an amount set so that when the substrate is fully cut by the projection to the depth corresponding to the middle of the thickness of the holding tape or the holding jig, the abrasive grain layer formed on the outer circumferential surface of the cylindrical base comes into contact with the upper surface of each chip to thereby grind the upper surface of each chip, thereby reducing the thickness of each chip to a predetermined thickness.

Preferably, the substrate includes a package substrate including a wiring substrate, a plurality of semiconductor chips mounted on the wiring substrate, and a resin layer sealing the semiconductor chips. The chips includes a plurality of semiconductor packages obtained by dividing the package substrate, each semiconductor package having an upper surface and an inclined side surface. The substrate processing method further includes a shield layer forming step for forming a shield layer on the upper surface and the inclined side surface of each semiconductor package after performing the dividing step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
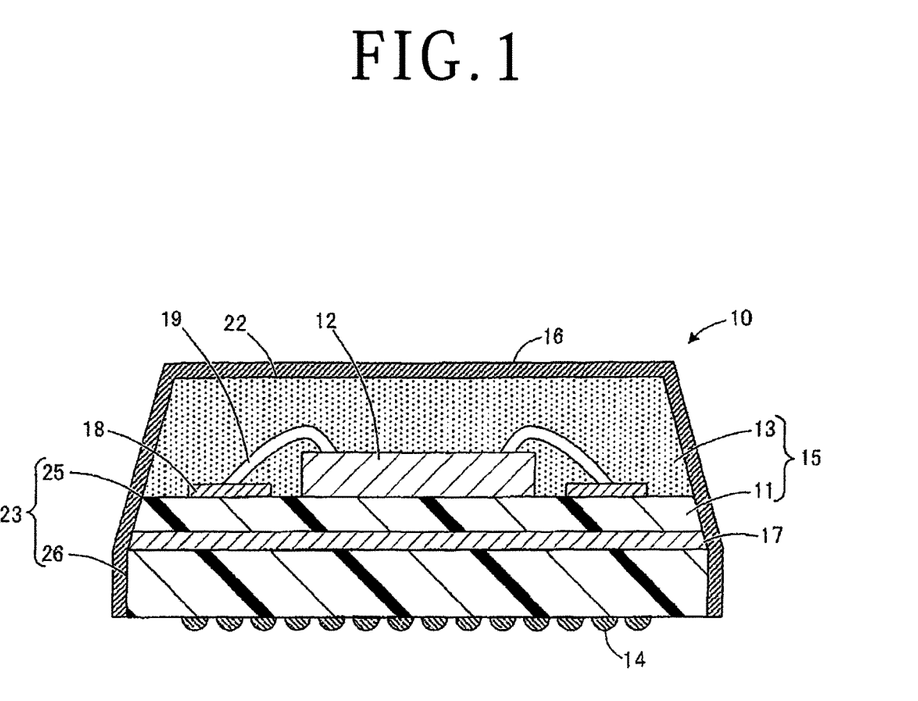
FIG. 1 is a schematic sectional view of a semiconductor package manufactured by a substrate processing method according to a preferred embodiment of the present invention.
Figure 2A:
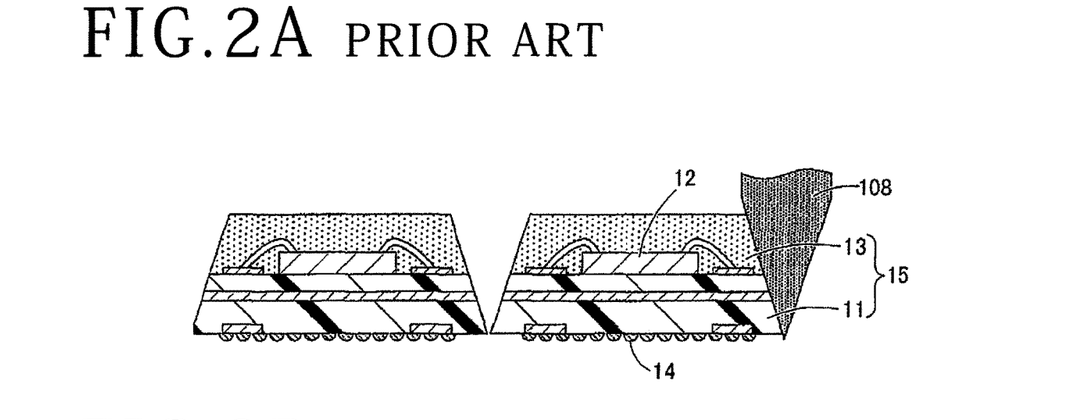
FIGS. 2A and 2B are schematic sectional views showing semiconductor package manufacturing methods in the prior art as different comparisons.
Figure 2B:
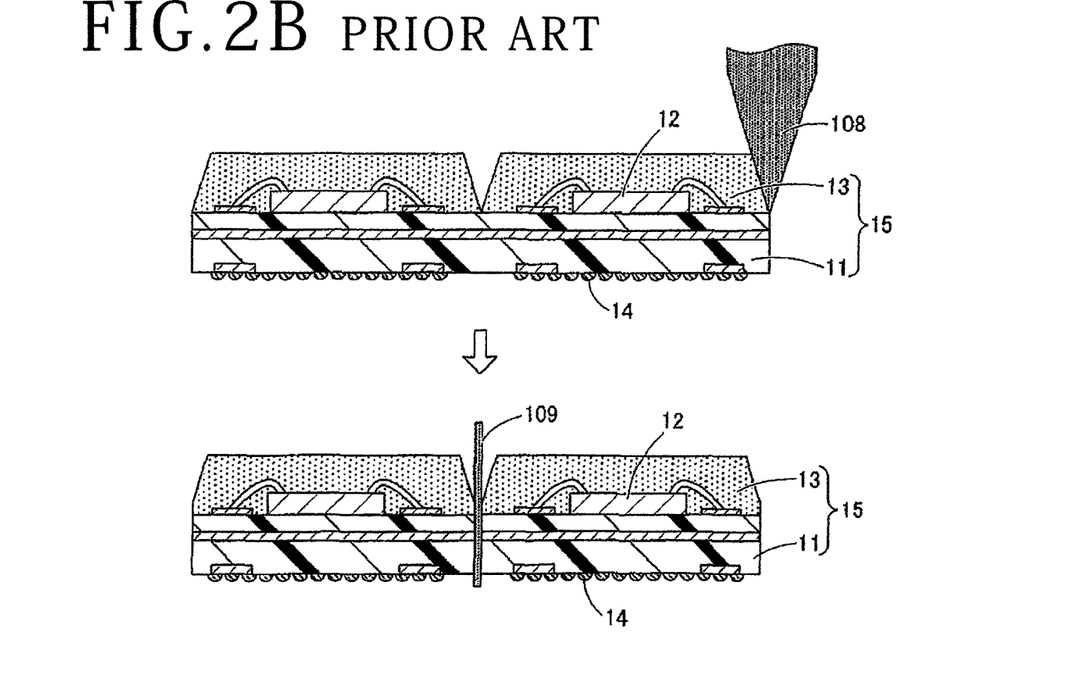

A substrate processing method according to a preferred embodiment of the present invention will now be described with reference to the attached drawings. In the following description, a package substrate is used as an example of the substrate. However, the kind of the substrate is not limited to a package substrate. FIG. 1 is a schematic sectional view of a semiconductor package manufactured by the method according to this preferred embodiment. FIGS. 2A and 2B are schematic sectional views showing semiconductor package manufacturing methods in the prior art as different comparisons. The following preferred embodiment is merely illustrative. For example, a certain step may be interposed between the adjacent steps of the processing method or the order of the steps of the processing method may be suitably changed.

Referring to FIG. 1, there is shown a semiconductor package 10 having a shield layer 16 forming an outer surface. The semiconductor package 10 is a packaged semiconductor apparatus required to have an electromagnetic shielding function against so-called electromagnetic interference (EMI). That is, the shield layer 16 functions to suppress the leakage of electromagnetic noise from the semiconductor package 10 to the outside thereof. A semiconductor chip 12 is mounted on the upper surface (front side) of a wiring substrate (interposer substrate) 11. The semiconductor chip 12 is sealed with a resin layer (sealing compound) 13. The resin layer 13 is surrounded by the shield layer 16. Further, bumps 14 are provided on the lower surface (back side) of the wiring substrate 11. The wiring substrate 11 is formed with various wiring including electrode 18 and a ground line 17. The electrodes 18 are connected through wires 19 to the semiconductor chip 12.

The semiconductor chip 12 is formed by dividing a semiconductor wafer having a semiconductor substrate and a plurality of devices formed on the semiconductor substrate, wherein the semiconductor wafer is divided into a plurality of semiconductor chips individually having the devices. The semiconductor chip 12 is mounted on the wiring substrate 11 at a predetermined position in such a manner as to be bonded through the wires 19 to the electrodes 18 formed on the wiring substrate 11. The semiconductor package 10 has an upper surface 22 and a side surface 23 (the side surface of each chip) extending downward from the upper surface 22, wherein the side surface 23 has an inclined side surface 25 inclined so as to be reverse-tapered toward the bottom of the semiconductor package 10. That is, the lower surface of the semiconductor package 10 is larger than the upper surface 22. The shield layer 16 is formed by sputtering, for example, from the upper side of the semiconductor package 10 to the inclined side surface 25. Unlike a general semiconductor package having a vertical side surface, the inclined side surface 25 of the side surface 23 of the semiconductor package 10 is inclined so as to obliquely intersect the direction (vertical direction) of film deposition for the shield layer 16, so that the shield layer 16 can be easily formed on the inclined side surface 25.

Referring to FIG. 2A, there is shown a conventional semiconductor package manufacturing method as a first comparison, wherein a plurality of semiconductor chips 12 are mounted on a wiring substrate 11 and sealed with a resin layer 13 to form a package substrate 15, and the package substrate 15 is fully cut by using a cutting blade 108 having a V-shaped tip (which will be hereinafter referred to as "V blade") to thereby form the inclined side surface of each semiconductor package. However, since the wiring substrate 11 includes various wiring (metal) as described above, the V blade 108 is greatly worn in cutting the wiring substrate 11, so that the V-shaped tip of the V blade 108 is easily broken. As a result, variations in depth of cut by the V blade 108 may occur and the life of the V blade 108 may be reduced.

FIG. 2B shows a second comparison intended to solve this problem, wherein the package substrate 15 is divided by step cutting using the V blade 108 and a usual cutting blade 109 (which will be hereinafter referred to as "straight blade"). That is, the package substrate 15 is divided into individual semiconductor packages 10 in such a manner that the resin layer 13 is first fully cut by the V blade 108 and the wiring substrate 11 is next fully cut by the straight blade 109 along a V groove formed by the V blade 108. With this configuration, the amount of cutting of the wiring substrate 11 by the V blade 108 can be reduced to thereby suppress the wearing of the V-shaped tip of the V blade 108. However, the cutting of the package substrate 15 is performed in two steps, so that the number of man-hours and the working time are increased to cause a reduction in productivity.

In the substrate processing method according to this preferred embodiment, a profile grinding tool 41 (see FIG. 4A) as a shaped abrasive member is used to cut the package substrate 15 along a plurality of division lines at one time, thereby dividing the package substrate 15 so as to form an inclined side surface of each semiconductor package 10. The profile grinding tool 41 has an inclined portion capable of cutting the package substrate 15 to form the inclined side surface and also has a straight portion capable of cutting the wiring substrate 11 to thereby divide the package substrate 15 into the individual semiconductor packages 10. Thus, the side surface 23 of each semiconductor package 10 can be inclined and the package substrate 15 can be divided at one time, so that the number of man-hours and the working time can be reduced to thereby improve the productivity.

Figure 3A:
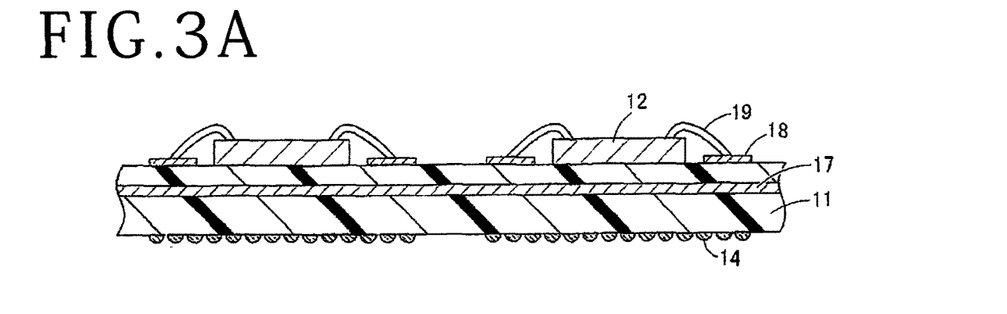
FIGS. 3A to 3C are schematic sectional views showing a semiconductor package manufacturing method according to a preferred embodiment of the present invention.
Figure 3B:
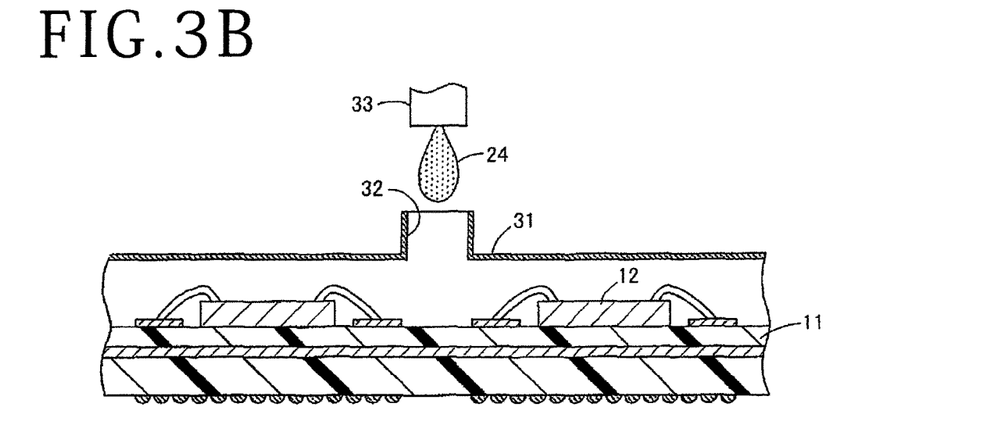
Figure 3C:
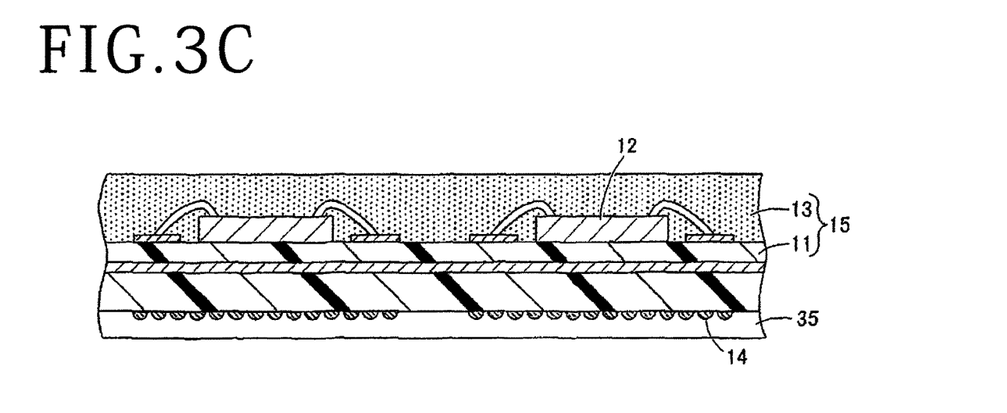
Figure 4A:
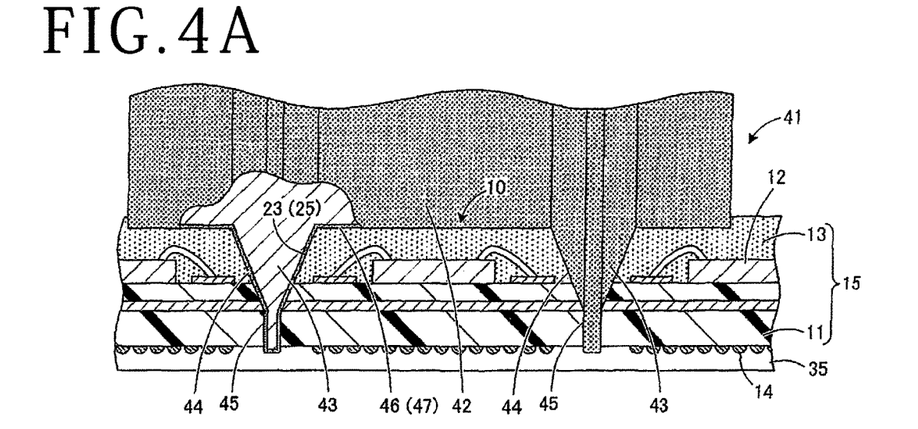
FIGS. 4A to 4C are schematic sectional views showing the semiconductor package manufacturing method according to this preferred embodiment to be performed subsequent to the step shown in FIG. 3C.
Figure 4B:
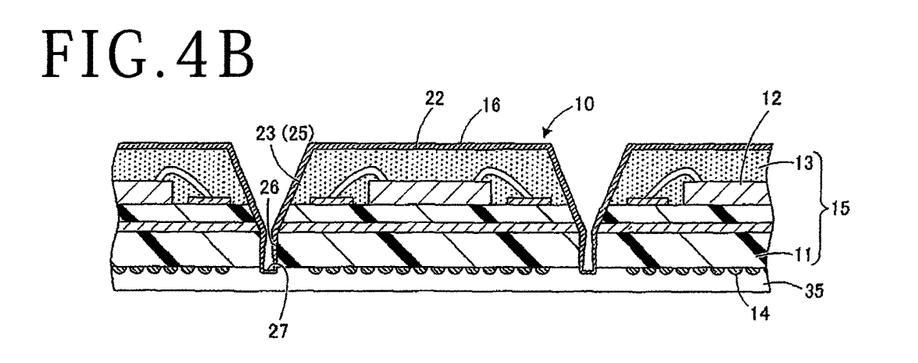
Figure 4C:
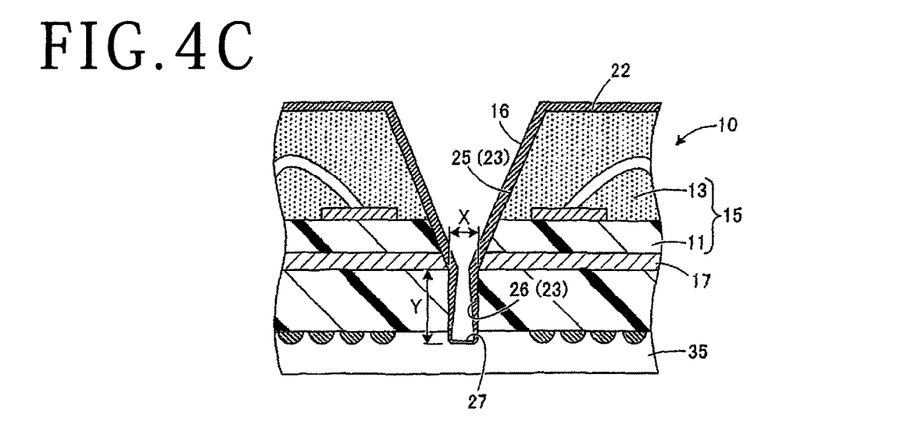

A semiconductor package manufacturing method as the substrate processing method according to this preferred embodiment will now be described with reference to FIGS. 3A to 3C and FIGS. 4A to 4C. FIG. 3A shows a mounting step, FIG. 3B shows a substrate forming step, and FIG. 3C shows a holding step. FIG. 4A shows a dividing step, and FIGS. 4B and 4C show a shield layer forming step.

As shown in FIG. 3A, the mounting step is first performed. In the mounting step, a plurality of semiconductor chips 12 are mounted on the upper surface (front side) of a wiring substrate 11 so as to be individually located in a plurality of separate regions defined by a plurality of crossing division lines set on the upper surface of the wiring substrate 11. More specifically, wiring (distribution lines) including a ground line 17 is formed in the wiring substrate 11, and bumps 14 are provided on the lower surface (back side) of the wiring substrate 11. Further, each semiconductor chip 12 is connected through wires 19 to the wiring substrate 11. Electrodes (not shown) are formed on the upper surface of each semiconductor chip 12, and electrodes 18 are formed on the upper surface of the wiring substrate 11, wherein one end of each wire 19 is connected to each electrode of the semiconductor chip 12, and the other end of each wire 19 is connected to each electrode 18 of the wiring substrate 11. While such wire bonding is performed in the mounting step in this preferred embodiment, flip chip bonding may be performed instead. In the flip chip bonding, the electrodes formed on the lower surface of each semiconductor chip 12 are directly connected to the electrodes formed on the upper surface of the wiring substrate 11.

As shown in FIG. 3B, the substrate forming step is performed after performing the mounting step. In the substrate forming step, a sealing compound 24 is supplied to the upper surface of the wiring substrate 11 on which the plural semiconductor chips 12 have been mounted, thereby sealing the semiconductor chips 12 with the sealing compound 24 to form a package substrate 15 (see FIG. 3C). More specifically, the lower surface of the wiring substrate 11 is held by a holding jig (not shown), and a mold 31 is set so as to cover the upper surface of the wiring substrate 11. The mold 31 has an upper wall formed with an inlet opening 32, and a nozzle 33 for supplying the sealing compound 24 is positioned directly above the inlet opening 32.

In operation, the sealing compound 24 is supplied from the nozzle 33 through the inlet opening 32 to the upper surface of the wiring substrate 11 until the inside space of the mold 31 is filled with the sealing compound 24, thereby sealing the semiconductor chips 12 with the sealing compound 24. Thereafter, the sealing compound 24 is heated or dried to be cured, thereby forming a resin layer 13 (see FIG. 3C) on the upper surface of the wiring substrate 11. Thus, the package substrate 15 is composed of the wiring substrate 11 and the resin layer 13 formed on the upper surface of the wiring substrate 11, wherein the plural semiconductor chips 12 are sealed in the resin layer 13. The sealing compound 24 is a curable liquid resin. Examples of the curable resin include epoxy resin, silicone resin, urethane resin, unsaturated polyester resin, acrylic urethane resin, and polyimide resin. While the sealing compound 24 is a liquid resin in this preferred embodiment, a sheet resin or a powder resin may be used instead. In this manner, the plural semiconductor chips 12 mounted on the wiring substrate 11 can be sealed collectively. In the case that the package substrate 15 is previously formed, the mounting step and the substrate forming step may be omitted.

As shown in FIG. 3C, the holding step is performed after performing the substrate forming step. In the holding step, a holding tape 35 is attached to the lower surface (back side) of the package substrate 15. The holding tape 35 is previously supported in its peripheral portion to a ring frame having a central opening. Accordingly, a central portion of the holding tape 35 is attached to the back side of the package substrate 15 in such a manner that the central opening of the ring frame is closed by the holding tape 35 and the package substrate 15 is located in the central opening of the ring frame. Thus, the package substrate 15 is supported through the holding tape 35 to the ring frame. The holding tape 35 has an adhesive layer, and the bumps 14 provided on the lower surface of the package substrate 15 (the wiring substrate 11) are embedded in the adhesive layer of the holding tape 35, thereby well holding the package substrate 15 on the holding tape 35. The ring frame to be used in the holding step may be a ring frame having a circular outside shape as viewed in plan or a ring frame having a quadrangular outside shape as viewed in plan.

As shown in FIG. 4A, the dividing step is performed after performing the holding step. In the dividing step, a profile grinding tool 41 having an outside shape corresponding to the outside shape of each semiconductor package 10 is mounted on a horizontally extending spindle (not shown) at a front end thereof. The profile grinding tool 41 includes a cylindrical base 42 extending in a horizontal direction and a pair of projections 43 projecting radially outward from the outer circumferential surface of the cylindrical base 42, wherein the pair of projections 43 are arranged so as to correspond to any adjacent ones of the plural division lines. Each projection 43 has an inclined side surface. Each projection 43 has a taper portion having a thickness gradually decreasing from the base end (upper end as viewed in FIG. 4A) toward the front end (lower end as viewed in FIG. 4A) and a straight portion projecting from the front end of the taper portion to the radially outermost end (lowermost end as viewed in FIG. 4A), wherein the straight portion has a fixed thickness. In other words, the side surface of each projection 43 is composed of an inclined side surface 44 projecting radially outward from the outer circumferential surface of the base 42 and a vertical surface 45 projecting radially outward from the radially outer end of the inclined side surface 44.

Further, an abrasive grain layer 46 is formed so as to cover the outer circumferential surface of the base 42 of the profile grinding tool 41. The abrasive grain layer 46 is formed by electrodeposition of diamond abrasive grains, for example, on the outer circumferential surface of the base 42. The abrasive grain layer 46 is also formed so as to cover the outer surface of each projection 43. That is, the abrasive grain layer 46 is formed on the opposite side surfaces and the front end surface of each projection 43. That is, the abrasive grain layer 46 is formed on the outer circumferential surface of the base 42 in an area between the pair of projections 43. By forming the abrasive grain layer 46 between the pair of projections 43, a grinding surface 47 is formed to grind the resin layer 13 of the package substrate 15. The amount of projection of each projection 43 is set so that when each projection 43 cuts the package substrate 15 so as to penetrate into the holding tape 35 to thereby divide the package substrate 15 into the semiconductor packages 10 as shown in FIG. 4A, the resin layer 13 is ground by the grinding surface 47 formed between the pair of projections 43 and the thickness of each semiconductor package 10 is accordingly reduced to a predetermined thickness.

In the dividing step, the wiring substrate 11 of the package substrate 15 is held through the holding tape 35 on a chuck table (not shown). In this condition, the package substrate 15 is cut along the division lines by the projections 43 of the profile grinding tool 41 so that the projections 43 reach the middle of the thickness of the holding tape 35, thereby dividing the package substrate 15 into the individual semiconductor packages 10. Prior to cutting the package substrate 15, each projection 43 of the profile grinding tool 41 is aligned to the corresponding division line at a horizontal position outside the package substrate 15, and each projection 43 is lowered to a vertical position corresponding to the depth of the middle of the thickness of the holding tape 35, at the above horizontal position. Thereafter, the package substrate 15 is fed in a horizontal direction relative to the profile grinding tool 41, thereby dividing the package substrate 15 along the division lines.

Thus, the package substrate 15 is divided by the pair of projections 43, and at the same time the resin layer 13 of the package substrate 15 is ground by the grinding surface 47 formed between the pair of projections 43. Accordingly, the package substrate 15 is divided into the individual semiconductor packages 10, and at the same time the thickness of each semiconductor package 10 is reduced to a predetermined thickness. Further, the side surface of each projection 43 has the inclined side surface 44 projecting radially outward from the outer circumferential surface of the base 42, so that the side surface 23 of each semiconductor package 10 has an inclined surface formed by the inclined side surface 44 of each projection 43, wherein the inclined surface of the side surface 23 of each semiconductor package 10 is inclined so as to be reverse-tapered toward the bottom of each semiconductor package 10. In this manner, the package substrate 15 can be divided into the individual semiconductor packages 10 as forming the inclined surface as a part of the side surface 23 of each semiconductor package 10 without performing step cutting.

As shown in FIG. 4B, the shield layer forming step is performed after performing the dividing step. In the shield layer forming step, a conductive material is deposited from the upper side of the resin layer 13 to the upper surface 22 of each semiconductor package 10 (the upper surface of the resin layer 13) and the side surface 23 of each semiconductor package 10, thereby forming a shield layer 16 on the upper surface 22 and the side surface 23 of each semiconductor package 10. More specifically, each semiconductor package 10 is held through the holding tape 35 on a holding jig (not shown). In this condition, the conductive material is deposited by sputtering or the like under predetermined film deposition conditions from the upper side of the resin layer 13 to each semiconductor package 10, thereby forming the shield layer 16 having a predetermined thickness on the upper surface 22 and the side surface 23 of each semiconductor package 10.

As shown in FIG. 4B, an inclined side surface 25 is formed as a part of the side surface 23 of each semiconductor package 10. The inclined side surface 25 is inclined so as to be reverse-tapered from the upper surface 22 toward the bottom of each semiconductor package 10. That is, the inclined side surface 25 is inclined so as to obliquely intersect the direction (vertical direction) of film deposition for the shield layer 16, so that the shield layer 16 can be easily formed in such a manner that a conductive film having a thickness capable of exhibiting a sufficient shield effect can be deposited not only the upper surface 22, but also on the inclined side surface 25 of the side surface 23. As shown in FIG. 4B, the side surface 23 of each semiconductor package 10 has a vertical surface 26 formed below the inclined side surface 25, and a groove having a bottom 27 is formed between any adjacent ones of the semiconductor packages 10. The shield layer 16 is also formed on the vertical surface 26 of each semiconductor package 10 and the bottom 27 of each groove. Accordingly, in picking up each semiconductor package 10, there is a possibility that burrs may be generated from the shield layer 16 at a lower portion of each semiconductor package 10.

In this case, the generation of the burrs in each semiconductor package 10 can be suppressed by adjusting the aspect ratio (the ratio between the width and the depth of the groove between the adjacent semiconductor packages 10). As shown in FIG. 4C, the aspect ratio between the adjacent semiconductor packages 10 is represented by Y/X, where Y (mm) is the depth of the groove from the lower end of the inclined side surface 25 (i.e., the upper end of the vertical surface 26) to the bottom 27 of the groove, and X (mm) is the width of the groove, i.e., the spacing between the opposed vertical surfaces 26 of the adjacent semiconductor packages 10. The lower portion of the vertical surface 26 of each side surface 23 and the bottom 27 of the groove between the adjacent semiconductor packages 10 are prone to be influenced by the aspect ratio. That is, when the aspect ratio between the adjacent semiconductor packages 10 is increased, the thickness of the shield layer 16 is reduced.

Accordingly, by setting the film deposition conditions for the shield layer 16 and also setting the thickness and the amount of projection of the straight portion having the fixed thickness of each projection 43 (see FIG. 4A) so as to obtain a desired aspect ratio, the thickness of the shield layer 16 at the bottom 37 of the groove formed between the adjacent semiconductor packages 10 can be reduced. With this configuration, the thickness of the shield layer 16 formed on the inclined side surface 25 of each side surface 23 becomes a suitable thickness for the shield effect because the influence of the aspect ratio is less, whereas the thickness of the shield layer 16 formed on the lower portion of the vertical surface 26 and the bottom 27 of the groove between the adjacent semiconductor packages 10 becomes a small thickness because the influence of the aspect ratio is more. Accordingly, the leakage of electromagnetic noise can be suppressed by the shield layer 16 at the upper portion of each semiconductor package 10, and the generation of burrs can be suppressed by reducing the thickness of the shield layer 16 at the lower portion of each semiconductor package 10.

The ground line 17 in the wiring substrate 11 is exposed to the lower portion of the inclined side surface 25 of each side surface 23. The shield layer 16 having a suitable thickness is formed on the lower portion of the inclined side surface 25, so that the shield layer 16 is connected to the ground line 17. Accordingly, the electromagnetic noise generated in each semiconductor package 10 can be removed through the ground line 17 to the outside of each semiconductor package 10. Further, the shield layer 16 formed on the lower portion of the vertical surface 26 of each side surface 23 is thin. However, electromagnetic noise can be cut off by various wiring (not shown) formed in the wiring substrate 11. Accordingly, the leakage of electromagnetic noise to any electronic components about each semiconductor package 10 can be generally prevented. Further, it is only essential that the ground line 17 in the wiring substrate 11 is to be connected to the shield layer 16. Accordingly, the ground line 17 may be connected to the shield layer 16 formed on the vertical surface 26 of each side surface 23.

The conductive material for forming the shield layer 16 is metal such as copper, titanium, nickel, and gold. By selecting at least one of such metals to form a multilayer film having a thickness of several micrometers or more as the shield layer 16. The shield layer 16 may be formed by any method such as sputtering, ion plating, spray coating, chemical vapor deposition (CVD), ink jet printing, and screen printing. As another method, the shield layer 16 may be formed by a vacuum lamination method such that a metal film having the above multilayer film is bonded to the upper surface 22 and the side surface 23 of each semiconductor package 10 in a vacuum. Thusly, the upper surface 22 and the side surface 23 of each semiconductor package 10 are covered with the shield layer 16 to manufacture each semiconductor package 10.

Figure 5:
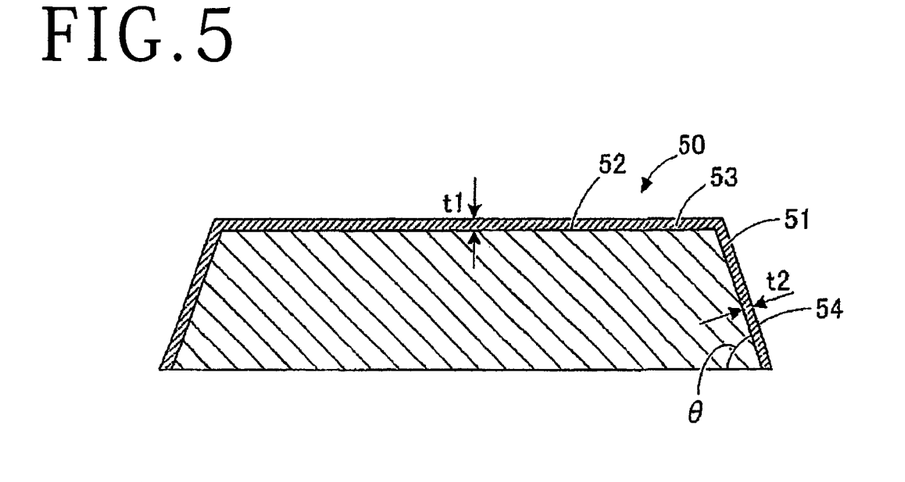
FIG. 5 is a sectional view showing the thickness of a shield layer formed on a sample.
Figure 6:
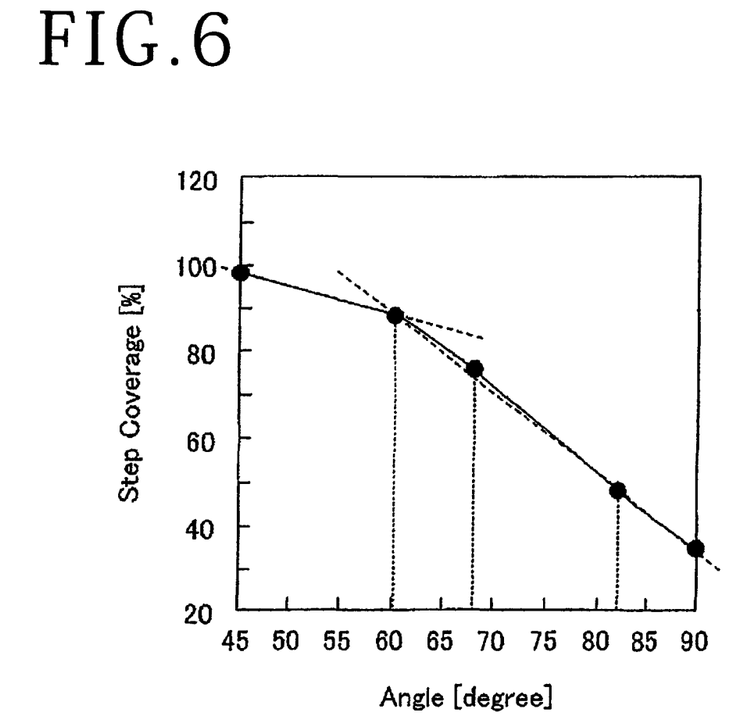
FIG. 6 is a graph showing the relation between the angle of inclination of the side surface of the sample and the thickness of the shield layer.

There will now be described the relation between the angle of inclination of the inclined side surface 25 of each semiconductor package 10 and the thickness of the shield layer 16. FIG. 5 is a sectional view showing the thickness of a shield layer formed on a sample. FIG. 6 is a graph showing the relation between the angle θ of inclination of the side surface of the sample and the thickness of the shield layer.

As shown in FIG. 5, reference numeral 50 denotes a sample having an upper surface 52 and a side surface 51. Further, an upper shield layer 53 is formed on the upper surface 52, and a side shield layer 54 is formed on the side surface 51. The side surface 51 is inclined by an angle θ with respect to a vertical direction. The present inventor performed a test to examine the relation between the angle θ of inclination of the side surface 51 of the sample 50 and the thickness of each shield layer. In this test, a plurality of samples 50 having different inclination angles θ were prepared to form a shield layer by performing an ion plating method at a temperature of 180° C. under a pressure of $8 \times 10^{-4}$ Pa. The angle θ of inclination of the side surface 51 was set to 90, 82, 68, 60, and 45 degrees. Further, the upper shield layer 53 formed on the upper surface 52 and the side shield layer 54 formed on the side surface 51 were observed by using a scanning electron microscope, and a thickness t1 of the upper shield layer 53 and a thickness t2 of the side shield layer 54 were measured according to the images obtained by the scanning electron microscope. The thicknesses t1 and t2 of the upper and side shield layers 53 and 54 were used to calculate a step coverage defined below in Equation (1). FIG. 6 shows the relation between the step coverage and the inclination angle θ.

$$\text{Step coverage} = (t2/t1) \times 100 \quad (1)$$

As apparent from FIG. 6, the step coverage gradually increases with a decrease in the inclination angle θ from 90 degrees, and when the inclination angle θ becomes 45 degrees, the step coverage becomes 100%. More specifically, when the inclination angle θ was set to 45 degrees, the thickness t1 of the upper shield layer 53 was equal to the thickness t2 of the side shield layer 54. That is, it was confirmed that when the inclination angle θ is 45 degrees, the thickness of the shield layer formed on the upper surface 52 and the side surface 51 of the sample 50 is uniform. Further, the present inventor found that when the step coverage becomes less than 50%, much time is required to form the side shield layer 54, resulting in an increase in process cost. Accordingly, the step coverage is preferably set to 50% or more. That is, the inclination angle θ of the inclined side surface 25 of each semiconductor package 10 is preferably set to 45 degrees or more and 82 degrees or less.

As described above, in the manufacturing method for each semiconductor package 10 according to this preferred embodiment, the profile grinding tool 41 having the pair of projections 43 for cutting the package substrate 15 is used. That is, the pair of projections 43 are simultaneously operated to cut the package substrate 15 along the plural division lines and thereby divide the package substrate 15 into the individual semiconductor packages 10. Further, each projection 43 has the inclined side surface 44, so that the inclined side surface 25 can be formed as a part of the side surface 23 of each semiconductor package 10 by each projection 43. Thusly, the package substrate 15 can be simultaneously divided along the plural division lines and at the same time the inclined side surface 25 can be formed on each semiconductor package 10. As a result, the number of man-hours can be reduced and the working time can be greatly reduced.

Figure 7A:
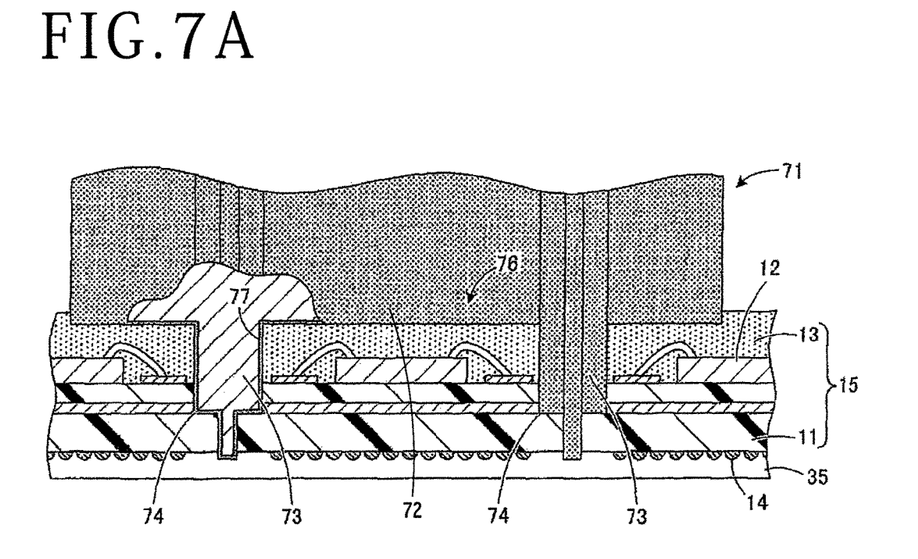
FIGS. 7A and 7B are schematic sectional views showing modifications of the dividing step in the method according to this preferred embodiment.

While the inclined side surface 25 is formed in the dividing step in the above preferred embodiment, this configuration is merely illustrative. For example, FIG. 7A shows a modification such that a step is formed on the side surface of each semiconductor package in the dividing step by using a profile grinding tool 71 as a shaped abrasive member. As shown in FIG. 7A, the profile grinding tool 71 has a pair of projections 73, and each projection 73 has a step portion 74 on each side surface. That is, each projection 73 is composed of a thick portion projecting radially outward from the outer circumferential surface of a cylindrical base 72 and a thin portion projecting radially outward from the outer end of the thick portion, wherein the thick portion has a relatively large fixed thickness and the thin portion has a relatively small fixed thickness. The package substrate 15 is cut by the pair of projections 73 of the profile grinding tool 71, so that the package substrate 15 is divided into individual semiconductor packages 76. At this time, the step portion 74 of each projection 73 functions to form a stepped side surface 77 of each semiconductor package 76. Accordingly, the lower surface of each semiconductor package 76 can be made larger than the upper surface of each semiconductor package 76 by the formation of the stepped side surface 77.

Figure 7B:
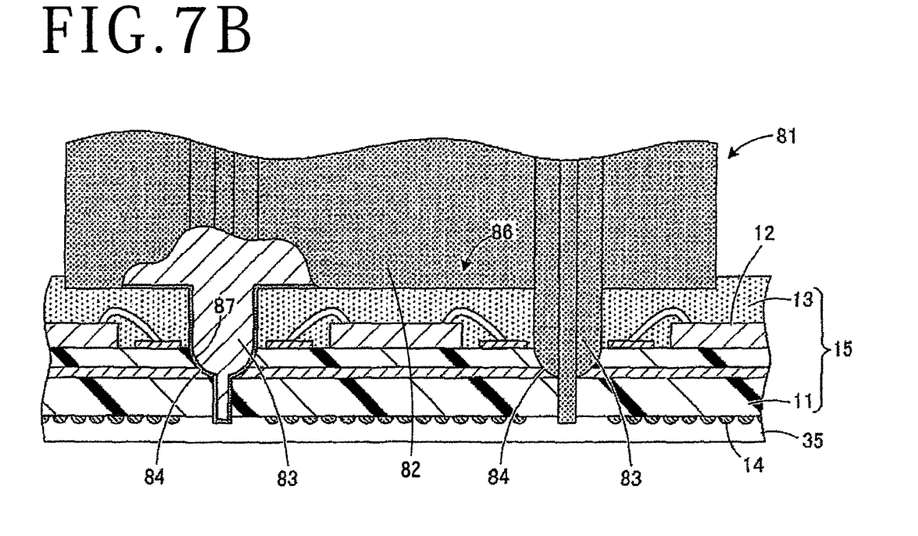

FIG. 7B shows another modification such that a curved surface is formed as the step on the side surface of each semiconductor package in the dividing step by using a profile grinding tool 81 as a shaped abrasive member. As shown in FIG. 7B, the profile grinding tool 81 has a pair of projections 83, and each projection 83 has a curved step portion 84 on each side surface. That is, each projection 83 is composed of a thick portion projecting radially outward from the outer circumferential surface of a cylindrical base 82 and a thin portion projecting radially outward from the outer end of the thick portion, wherein the outer end of the thick portion is curved and the thin portion has a relatively small fixed thickness. The package substrate 15 is cut by the pair of projections 83 of the profile grinding tool 81, so that the package substrate 15 is divided into individual semiconductor packages 86. At this time, the curved step portion 84 of each projection 83 functions to form a curved side surface 87 of each semiconductor package 86. Also in this configuration, the lower surface of each semiconductor package 86 can be made larger than the upper surface of each semiconductor package 86 by the formation of the curved side surface 87. Thus, the step to be formed on the side surface of each semiconductor package may be so configured as to provide a level difference with respect to the upper surface of each semiconductor package.

Figure 8:
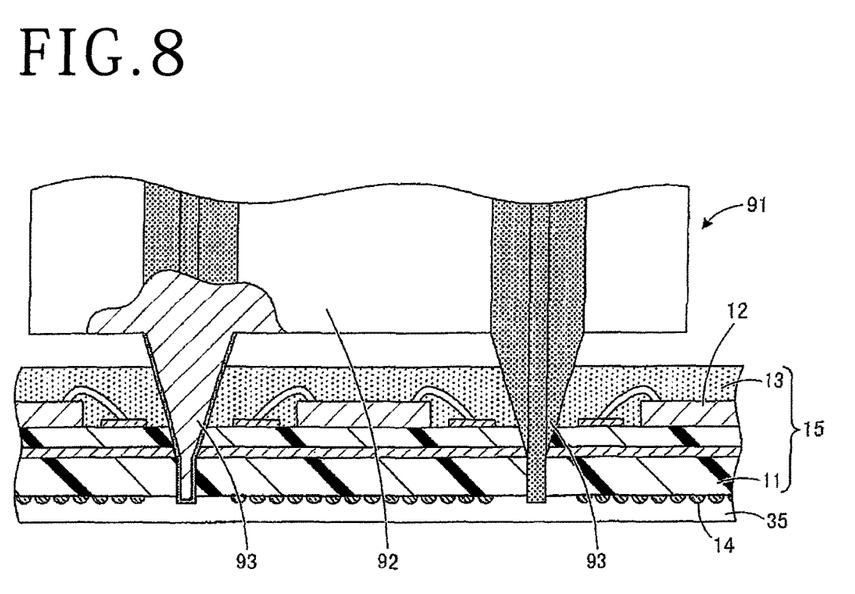
FIG. 8 is a schematic sectional view showing another modification of the dividing step.

Further, while the profile grinding tool 41 is used to divide the package substrate 15 and grind the resin layer 13 in the above preferred embodiment, this configuration is merely illustrative. For example, FIG. 8 shows a modification such that a profile grinding tool 91 as a shaped abrasive member is used to only divide the package substrate 15. As shown in FIG. 8, the profile grinding tool 91 has a cylindrical base 92 and a pair of projections 93 projecting radially outward from the outer circumferential surface of the base 92, wherein no abrasive grain layer is formed on the outer circumferential surface of the base 92 in an area between the pair of projections 93. The amount of projection of each projection 93 is set so that when the package substrate 15 is cut by each projection 93 to the depth corresponding to the middle of the thickness of the holding tape 35, the outer circumferential surface of the base 92 in the area between the pair of projections 93 is spaced from the upper surface of the package substrate 15 (the upper surface of the resin layer 13).

Figure 9:
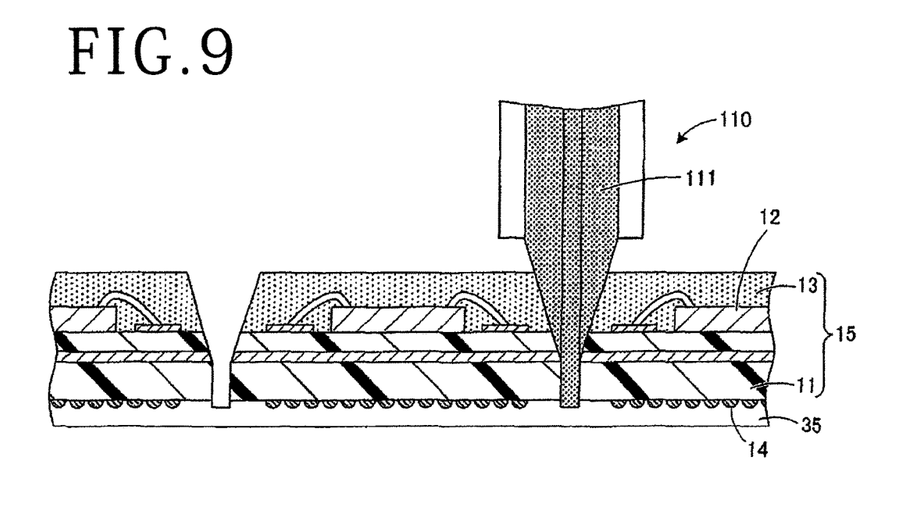
FIG. 9 is a schematic sectional view showing a further modification of the dividing step.

Further, while the profile grinding tool 41 has the plural projections 43 for cutting the package substrate 15 along the plural division lines at one time to thereby form the inclined side surface 25 on each semiconductor package 10 in the above preferred embodiment, this configuration is merely illustrative. For example, FIG. 9 shows a modification such that a single blade 110 having a single projection 111 is used as a shaped abrasive member to cut the package substrate 15 along each division line. The projection 111 has a sectional shape similar to that of each projection 43 shown in FIG. 4A. Accordingly, the package substrate 15 can be cut along each division line by the single projection 111 so as to form an inclined side surface on each semiconductor package 10, so that the number of man-hours and the working time can be reduced.

Figure 10:
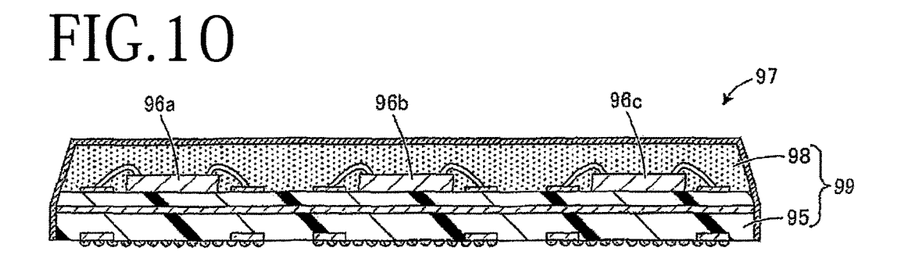
FIG. 10 is a schematic sectional view showing a modification of the semiconductor package in the present invention.

Further, while each semiconductor package 10 includes the single semiconductor chip 12 mounted on the wiring substrate 11 in the above preferred embodiment, a plurality of semiconductor chips may be mounted on a wiring substrate in each semiconductor package. For example, FIG. 10 shows a modification such that a plurality of (e.g., three) semiconductor chips 96a, 96b, and 96c are mounted on a wiring substrate 95 and these semiconductor chips 96a, 96b, and 96c are collectively shielded to manufacture a semiconductor package 97. These semiconductor chips 96a, 96b, and 96c may have the same function or may have different functions.

Figure 11:
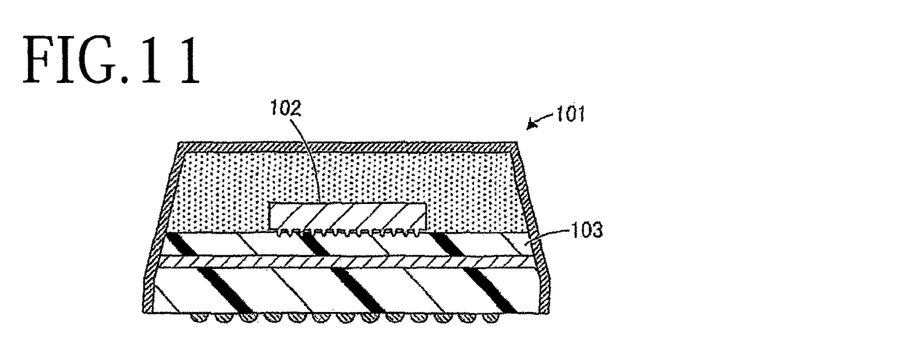
FIG. 11 is a schematic sectional view showing another modification of the semiconductor package in the present invention.

Further, while the semiconductor chip 12 is connected through the wires 19 to the electrodes 18 formed on the wiring substrate 11 in each semiconductor package 10 in the above preferred embodiment (wire bonding), this configuration is merely illustrative. For example, FIG. 11 shows a modification such that a semiconductor chip 102 is directly connected to the electrodes (not shown) formed on the upper surface of a wiring substrate 103 to thereby form a semiconductor package 101 (flip chip bonding).

Figure 12A:
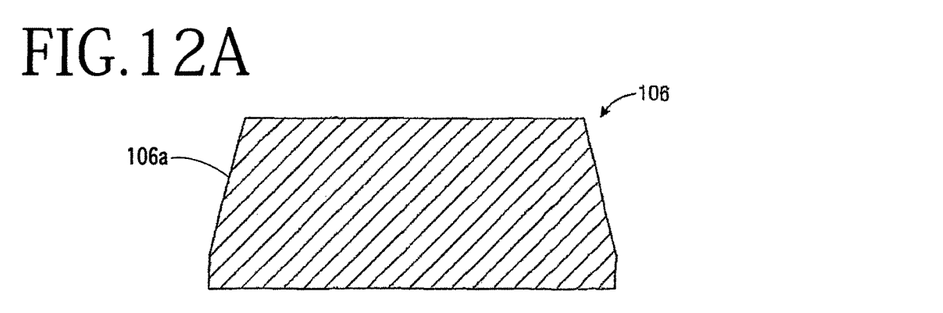
FIGS. 12A and 12B are sectional views showing modifications of the substrate.
Figure 12B:
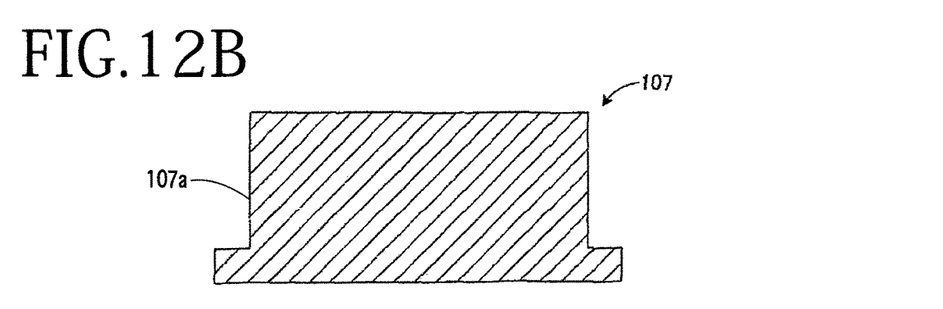

Further, while the substrate processing method according to the above preferred embodiment is a processing method for the package substrate 15 in the above preferred embodiment, this configuration is merely illustrative. For example, FIG. 12A shows a modification such that the substrate processing method is a processing method for a wafer, wherein the wafer is divided by the shaped abrasive member to obtain a chip 106 having an inclined side surface 106a. FIG. 12B shows another modification such that the substrate processing method is a processing method for a wafer, wherein the wafer is divided by the shaped abrasive member to obtain a chip 107 having a stepped side surface 107a. In the case of dividing an optical device wafer to manufacture light-emitting diode (LED) chips, a light extraction efficiency in each LED chip can be improved by forming such an inclined side surface or a stepped side surface on each LED chip.

Further, while the pair of projections 43 project from the outer circumferential surface of the cylindrical base 42 in the above preferred embodiment, this configuration is merely illustrative. For example, three or more projections may project from the outer circumferential surface of the cylindrical base 42.

Further, while the back side of the package substrate 15 is held by the holding tape 35 in the above preferred embodiment, this configuration is merely illustrative. For example, the back side of the package substrate 15 may be held by a holding jig. The holding jig may have any configuration capable of holding the package substrate 15. For example, a chuck table or a substrate may be used as the holding jig. While each semiconductor package is used in portable communications equipment such as mobile phones in this preferred embodiment, each semiconductor package in the present invention may be used in any other electronic equipment such as cameras.

Further, the workpiece to be processed in the substrate processing method according to the present invention may be any workpiece according to the kind of processing, such as a semiconductor device wafer, optical device wafer, package substrate, semiconductor substrate, inorganic material substrate, oxide wafer, green ceramic substrate, and piezoelectric substrate. The semiconductor device wafer may be a silicon wafer or compound semiconductor wafer on which devices are formed. The optical device wafer may be a sapphire wafer or silicon carbide wafer on which devices are formed. The package substrate may be a chip size package (CSP) substrate. The semiconductor substrate may be a silicon substrate or gallium arsenide substrate. The inorganic material substrate may be a sapphire substrate, ceramic substrate, or glass substrate. The oxide wafer may be a lithium tantalate wafer or lithium niobate wafer on which devices are formed or to be formed.

Further, the present invention is not limited to the above preferred embodiment and its related modifications, but various modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

Further, while the present invention is applied to the processing method for the substrate such as a package substrate and a wafer in the above preferred embodiment, the present invention is also applicable to a processing method for any workpiece to be divided into individual chips.

As described above, the present invention has an effect such that the substrate can be divided into individual chips and at the same time an inclined or stepped side surface can be formed on each chip.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A substrate processing method for dividing a substrate along a plurality of division lines formed on a front side of said substrate to obtain individual chips and simultaneously providing a desired shape on each chip, said substrate processing method comprising:

a holding step of holding a back side of said substrate by using a holding tape or a holding jig; and a dividing step of fully cutting said substrate along said division lines to such a depth corresponding to the middle of the thickness of said holding tape or said holding jig by using a shaped abrasive member after performing said holding step, thereby dividing said substrate into said individual chips;

said shaped abrasive member having a projection for cutting said substrate, said projection having an inclined side surface or a vertical side surface with a step portion;

said dividing step including the steps of cutting said substrate along each division line by using said projection to thereby divide said substrate into said individual chips and simultaneously forming an inclined side surface or a stepped side surface on each chip according to said inclined side surface or said vertical side surface with said step portion of said projection, wherein said inclined side surface or said stepped side surface on each chip is formed so that a lower surface of each chip becomes larger than an upper surface of each chip, wherein said substrate includes a package substrate including a wiring substrate, a plurality of semiconductor chips mounted on said wiring substrate, and a resin layer sealing said semiconductor chips.

2. The substrate processing method according to claim 1, wherein said chips includes a plurality of semiconductor packages obtained by dividing said package substrate, each semiconductor package having an upper surface and an inclined side surface, and said substrate processing method further comprising a shield layer forming step of forming a shield layer on the upper surface and the inclined side surface of each semiconductor package after performing said dividing step.

3. A substrate processing method for dividing a substrate along a plurality of division lines formed on a front side of said substrate to obtain individual chips and simultaneously providing a desired shape on each chip, said substrate processing method comprising:

a holding step of holding a back side of said substrate by using a holding tape or a holding jig; and a dividing step of fully cutting said substrate along said division lines to such a depth corresponding to the middle of the thickness of said holding tape or said holding jig by using a shaped abrasive member after performing said holding step, thereby dividing said substrate into said individual chips;

said shaped abrasive member having a protection for cutting said substrate, said projection having an inclined side surface or a vertical side surface with a step portion;

said dividing step including the steps of cutting said substrate along each division line by using said projection to thereby divide said substrate into said individual chips and simultaneously forming an inclined side surface or a stepped side surface on each chip according to said inclined side surface or said vertical side surface with said step portion of said projection, wherein said inclined side surface or said stepped side surface on each chip is formed so that a lower surface of each chip becomes larger than an upper surface of each chip, wherein said projection includes a plurality of projections individually corresponding to said plurality of division lines, each of said projections having an inclined side surface or a vertical side surface with a step portion.

4. A substrate processing method for dividing a substrate along a plurality of division lines formed on a front side of said substrate to obtain individual chips and simultaneously providing a desired shape on each chip, said substrate processing method comprising:

a holding step of holding a back side of said substrate by using a holding tape or a holding jig; and a dividing step of fully cutting said substrate along said division lines to such a depth corresponding to the middle of the thickness of said holding tape or said holding jig by using a shaped abrasive member after performing said holding step, thereby dividing said substrate into said individual chips;

said shaped abrasive member having a projection for cutting said substrate, said projection having an inclined side surface or a vertical side surface with a step portion;

said diving step including the steps of cutting said substrate along each division line by using said projection to thereby divide said substrate into said individual chips and simultaneously forming an inclined side surface or a stepped side surface on each chip according to said inclined side surface or said vertical side surface with said step portion of said projection, wherein said inclined side surface or said stepped side surface on each chip is formed so that a lower surface of each chip becomes larger than an upper surface of each chip wherein said shaped abrasive member further has a cylindrical base having an abrasive grain layer on an outer circumferential surface thereof, and said projection projects radially outward from the outer circumferential surface of said cylindrical base in an amount set so that when said substrate is fully cut by said projection to the depth corresponding to the middle of the thickness of said holding tape or said holding jig, said abrasive grain layer formed on the outer circumferential surface of said cylindrical base comes into contact with the upper surface of each chip to thereby grind the upper surface of each chip, thereby reducing the thickness of each chip to a predetermined thickness.

* * * * *

UNITED STATES PATENT AND TRADEMARK OFFICE
CERTIFICATE OF CORRECTION

PATENT NO. : 10,515,841 B2
APPLICATION NO. : 16/025075
DATED : December 24, 2019
INVENTOR(S) : Byeongdeck Jang et al.

It is certified that error appears in the above-identified patent and that said Letters Patent is hereby corrected as shown below:

In the Claims

In Column 13, Line 35, delete "protection" and replace with --projection--.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*